United States Patent [19]
Belot et al.

[11] Patent Number: 5,805,650
[45] Date of Patent: Sep. 8, 1998

[54] CIRCUIT FOR DATA TRANSMISSION IN ASYNCHRONOUS MODE WITH A FREE RECEPTION FREQUENCY LOCKED ON THE TRANSMISSION FREQUENCY

[75] Inventors: Didier Belot, Rives; Laurent Dugoujon, Saint Hilaire du Touvet, both of France

[73] Assignee: SGS-Thomson Microelectronics S.A., Saint Genis, France

[21] Appl. No.: 551,818

[22] Filed: Nov. 7, 1995

[30] Foreign Application Priority Data

Nov. 9, 1994 [FR] France ................................. 94 13786

[51] Int. Cl.$^6$ ............................................. H03D 3/24
[52] U.S. Cl. ............................................. 375/376; 331/1 R
[58] Field of Search ................... 331/2, 1 R, 1 A, 331/17, 25; 375/214, 219, 376, 374, 375; 327/156, 162

[56] References Cited

U.S. PATENT DOCUMENTS

| | | | |
|---|---|---|---|
| 4,001,691 | 1/1977 | Gruenberg | 375/214 |
| 4,015,083 | 3/1977 | Bellisio | 375/376 |
| 4,596,937 | 6/1986 | Johnson | 375/376 |
| 4,651,330 | 3/1987 | Ballance | 375/108 |
| 5,023,869 | 6/1991 | Gover et al. | 375/219 |
| 5,040,189 | 8/1991 | Braun | 375/214 |
| 5,063,577 | 11/1991 | Arbanas et al. | 375/376 |
| 5,075,639 | 12/1991 | Taya | 331/2 |
| 5,302,919 | 4/1994 | Abe | 331/2 |
| 5,359,298 | 10/1994 | Abe | 331/2 |

FOREIGN PATENT DOCUMENTS

| WO-A-93 14570 | 7/1993 | WIPO | H03L 7/06 |
|---|---|---|---|

*Primary Examiner*—Stephen Chin
*Assistant Examiner*—Joseph Roundtree
*Attorney, Agent, or Firm*—Wolf, Greenfield & Sacks, P.C.

[57] ABSTRACT

A circuit for transmitting data in asynchronous transfer mode includes two phase-locked loops associated with a transmission unit and a reception unit, respectively. Each PLL is provided with a voltage-controlled oscillator formed by an astable multivibrator. The reference current fixing the free oscillating frequency of the multivibrator that is associated with the reception unit corresponds to the frequency adjustment current of the multivibrator that is associated with the transmission unit. Each VCO includes a differential amplifier, connected as a voltage-to-current converter, receiving two voltages corresponding to the phase error of the loop with which it is associated, and providing a frequency adjustment current of its astable multivibrator.

8 Claims, 2 Drawing Sheets

CIRCUIT FOR DATA TRANSMISSION IN ASYNCHRONOUS MODE WITH A FREE RECEPTION FREQUENCY LOCKED ON THE TRANSMISSION FREQUENCY

BACKGROUND OF THE INVENTION

1. Field of the Invention

The present invention relates to ATM (Asynchronous Transfer Mode) circuits. The invention more particularly applies to the recovering of a sampling clock upon reception of the data transmitted in asynchronous mode.

2. Discussion of the Related Art

FIG. 1 schematically represents an ATM circuit. This circuit comprises a transmission unit 1 and a reception unit 2.

In the transmission unit, data to be transmitted are in the form of binary data transmitted in parallel (for example, 8 bits) by a data processing device 3 to a serialization multiplexer 4. The multiplexer 4 is controlled by a phase-locked loop (PLL) 5 providing a serial data transmission clock signal CLKTS which is in phase with the parallel data transmission frequency CLKTP provided by device 3. The output of multiplexer 4 is connected to a logic register 6. The output signal of register 6 is then provided onto the transmission line Tx which is generally in the form of a coaxial cable or an optical fiber.

In high speed applications, the clock frequency CLKTP is, for example, 77.76 MHz and the transmission frequency CLKTS which corresponds to the frequency provided by a voltage-controlled oscillator (VCO) of PLL 5 is, for example, 622.08 MHz.

In the reception unit, the received signal Rx is sent through a level amplifier 7 and is provided both to a demultiplexer 8 and a PLL 9. The PLL 9 is designed to recover the clock frequency CLKRS of the data signal DATA. Indeed, a characteristic of the data flow in ATM is that the data encoding clock frequency CLKTS is not transmitted. Only the data are transmitted, generally gathered by 48-bit cells preceded by 5-byte headers.

PLL 9 provides the demultiplexer 8 with the data sampling frequency CLKRS. The demultiplexer 8 provides the data processing device 3 with both the 8-bit data in parallel and their clock frequency CLKRP.

One problem lies in that the received signal is a pseudo random signal which is therefore unsteady. In addition, this pseudo random signal may have long periods of time during which the bits are steady. In practice, the signal received by PLL 9 of the reception unit 2 may include up to 72 steady bits. PLL 9 has a phase comparator which provides a low-pass filter with the result of the phase comparison between the received signal and a signal restored by a VCO comprised of an astable multivibrator. To provide the demultiplexer 8 with the sampling frequency CLKRS even during the periods of time when the bits are steady, PLL 9 is adjusted to the free running frequency CLKO of the multivibrator during these periods.

Using the free running frequency CLKO of the multivibrator as a sampling signal CLKRS requires that this free running frequency be adjustable as a function of the operation conditions, for example, of the operating temperature variations.

FIG. 2 represents a first known solution. The solution consists in placing an adjusting potentiometer 11 actuated in the absence of data to adjust the free running frequency CLKO of the multivibrator 12. The multivibrator 12 is current-controlled. The current is provided by the output of a differential amplifier 13, connected as a voltage-to-current converter and receiving at its input the two phase error voltages from the low-pass filter of PLL 9. The low-pass filter issues two error voltages, RE+ and RE−, provided that the circuit is a coupled-mode logic circuit (CML). The reference current of amplifier 13, i.e., the current about which the current Iosc(Rx) provided to the multivibrator 12 varies, is determined by a reference current Iref. Current Iref represents the sum of a current provided by an internal current source 14 and a current provided by an external current source 15 that is adjusted by the potentiometer 11. In the case where the bits of signal DATA are steady, the difference between the error voltages RE+ and RE− is zero and the current Iosc(Rx) is Iref.

This empirical means is not readily adapted for circuits produced by mass production. Indeed, with this solution, the user needs to manually adjust the circuit at the beginning of each transmission to adjust the free running frequency of the multivibrator 12 on the 622.08 MHz frequency.

FIG. 3 illustrates a second known solution which consists in using, during the periods when the received data are steady, the clock frequency CLKTS available in the transmission unit 1.

In transmission mode, the PLL 5 receives signal CLKTP from device 3. The phase of this clock frequency is compared in a phase comparator 20 with a frequency recovered by a divider 21 which receives the transmission frequency CLKTS. This frequency CLKTS is provided by the adjustment of a VCO 22 constituted as described previously by an astable multivibrator controlled from the output signal of a low-pass filter 23. Although the VCO 22 is, as in the case of FIG. 2, controlled by two phase error voltages provided by the filter 23, only one connection is illustrated for the sake of clarity.

In reception mode, PLL 9 also includes a phase comparator 24 followed by a low-pass filter 25 and a VCO 26 that is also constituted by an astable multivibrator. The VCO 26 provides the clock frequency CLKRS.

To determine the periods of time during which the reception unit should use the emission frequency CLKTS, the reception signal DATA is provided to a first input of a two-input multiplexer 27 whose second input receives the signal CLKTS from the VCO 22 through a divide-by-two frequency divider 29. Divider 29 is used because a data bit is present during a half-period of frequency CLKTS. The output of the multiplexer 27 constitutes the signal provided to the first input of the phase comparator 24 whose second input receives the output signal CLKRS of the VCO 26. The selection between the two inputs of multiplexer 27 is ensured by a frequency comparator 28 which compares the frequency of signal CLKTS with the frequency of signal CLKRS.

Thus, when the data signal is steady within a given period, the frequency CLKRS provided by the VCO's 26 significantly departs from the transmission clock frequency CLKTS. The multiplexer 27 then provides the phase comparator 24 with the signal provided by the divider 29 which corresponds to signal CLKTS divided by two in frequency. In contrast, outside these periods the frequencies CLKTS and CLKRS are nearly equal, and the multiplexer 27 provides the data signal DATA. The transmission frequency CLKTS is therefore used when the frequency CLKRS varies significantly and also at the starting-up of the circuit which corresponds to a steady period (no data are provided to the receiver).

A drawback of such a circuit lies in that, by using the transmission frequency CLKTS, several data cells of the transmitted signal are at risk of being lost. Indeed, the time constant of the low-pass filters is excessively long during the transmission of a data bit. This time constant is approximately 70 ns whereas, with a 622 MHz frequency, the duration of a bit is 3.2 ns. Although such a circuit suitably operates for a low frequency signal (approximately 500 KHz), its use in high speed circuits causes losses of data.

U.S. Pat. No. 5,302,919 describes a circuit for writing data in a hard disk, comprising two VCO's. This circuit uses a non-differential structure and is in MOS technology. This circuit which, because of its structure, is designed to work at frequencies of around 10 MHz, cannot be used for frequencies such as those used in high speed data transmissions because of the noise that would be added to the control signals. This noise would cause a phase jitter which would exceed the tolerable limits determined by standards of high speed transmissions.

SUMMARY OF THE INVENTION

An object of the present invention is to avoid the drawbacks of the existing solutions by providing a circuit which allows the use of the data transmission frequency in the reception unit when the received data do not allow the extraction of the reception frequency, while ensuring a steady frequency as a function of the operation conditions and avoiding loss of data.

In order to achieve these and other objects, the present invention provides a circuit for transmitting data in asynchronous transfer mode comprising two PLL's associated, respectively, with a transmission unit and a reception unit, each PLL being provided with a VCO formed by an astable multivibrator. The reference current fixing the free running frequency of the multivibrator that is associated with the reception unit corresponds to the frequency adjustment current of the multivibrator that is associated with the transmission unit. Each VCO comprises a differential amplifier, connected as a voltage-to-current converter, which receives two voltages corresponding to the phase error of the PLL with which it is associated, the differential amplifier providing a frequency adjustment current of its astable multivibrator.

According to an embodiment of the present invention, the output of the differential amplifier of the transmission oscillator is connected to a reference current terminal of the differential amplifier of the reception oscillator.

According to an embodiment of the present invention, all the differential stages of the circuit are achieved in bipolar technology.

According to an embodiment of the present invention, the free running frequency of the multivibrator associated with the transmission oscillator is fixed by the reference current to 622.08 MHz.

The foregoing and other objects, features, aspects and advantages of the invention will become apparent from the following detailed description of the present invention when take in conjunction with the accompanying drawings.

For the sake of clarity the same elements are designated with same references in the various figures. Moreover, even though all the components of the described circuits are coupled-mode logic circuits and therefore have complementary outputs, only one connection is illustrated between the various components. In practice, there are two connections between each component but they are illustrated only when they are needed to understand the invention.

DETAILED DESCRIPTION

Figure 1:
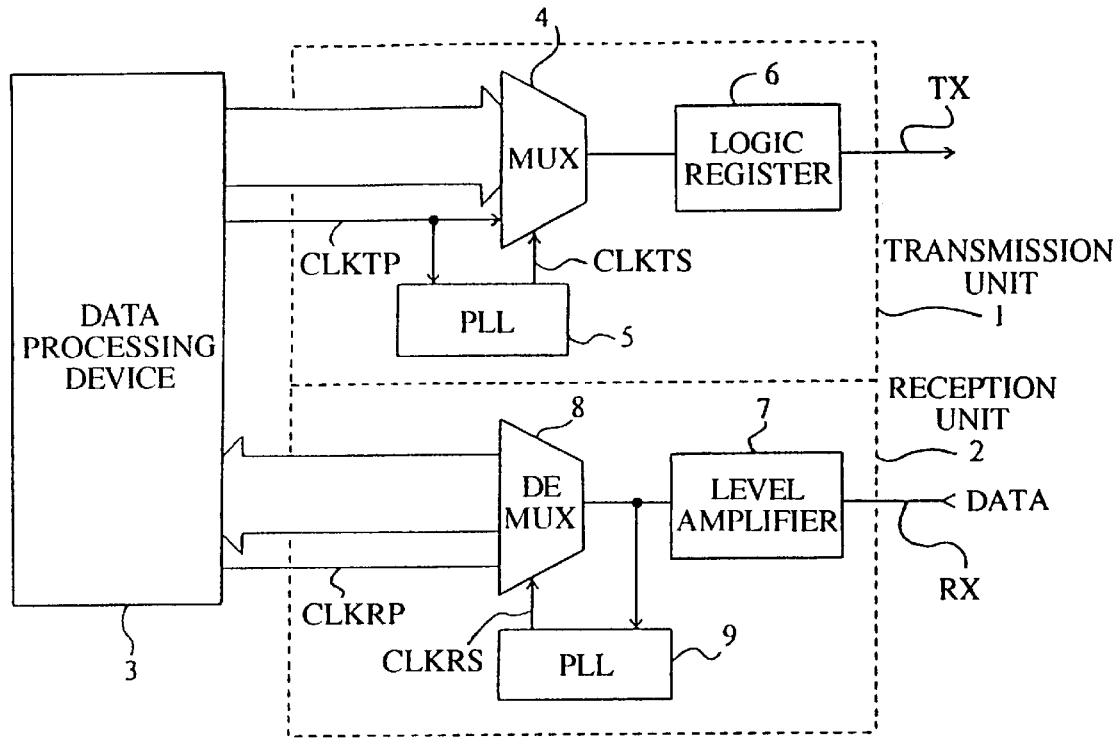
FIGS. 1–3, above described, are intended to illustrate the state of the art and the problem to solve.
Figure 2:
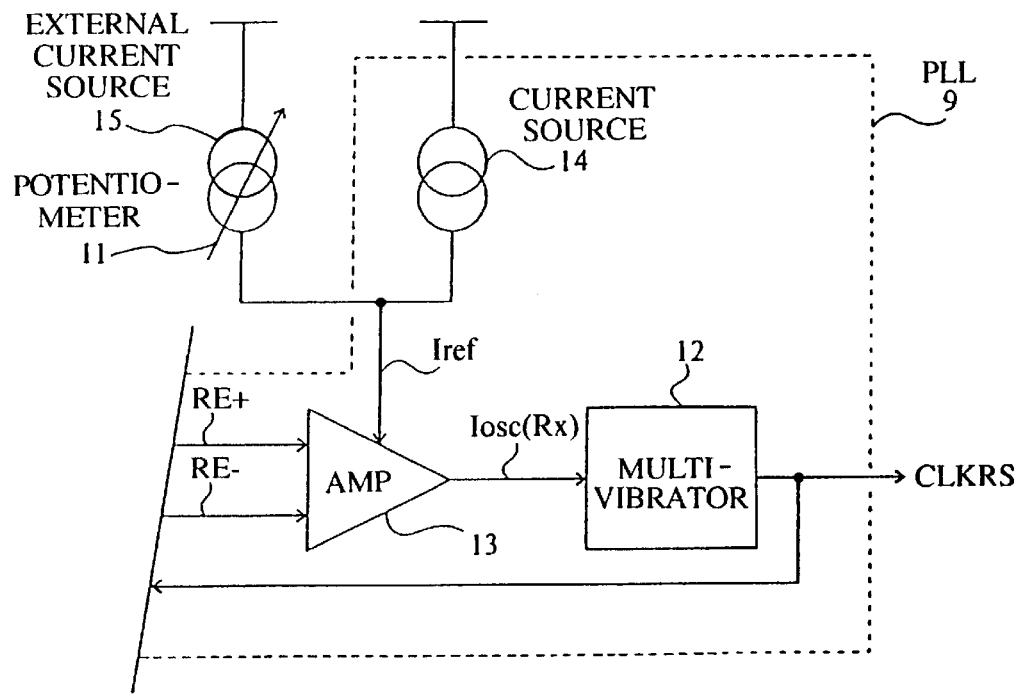
Figure 3:
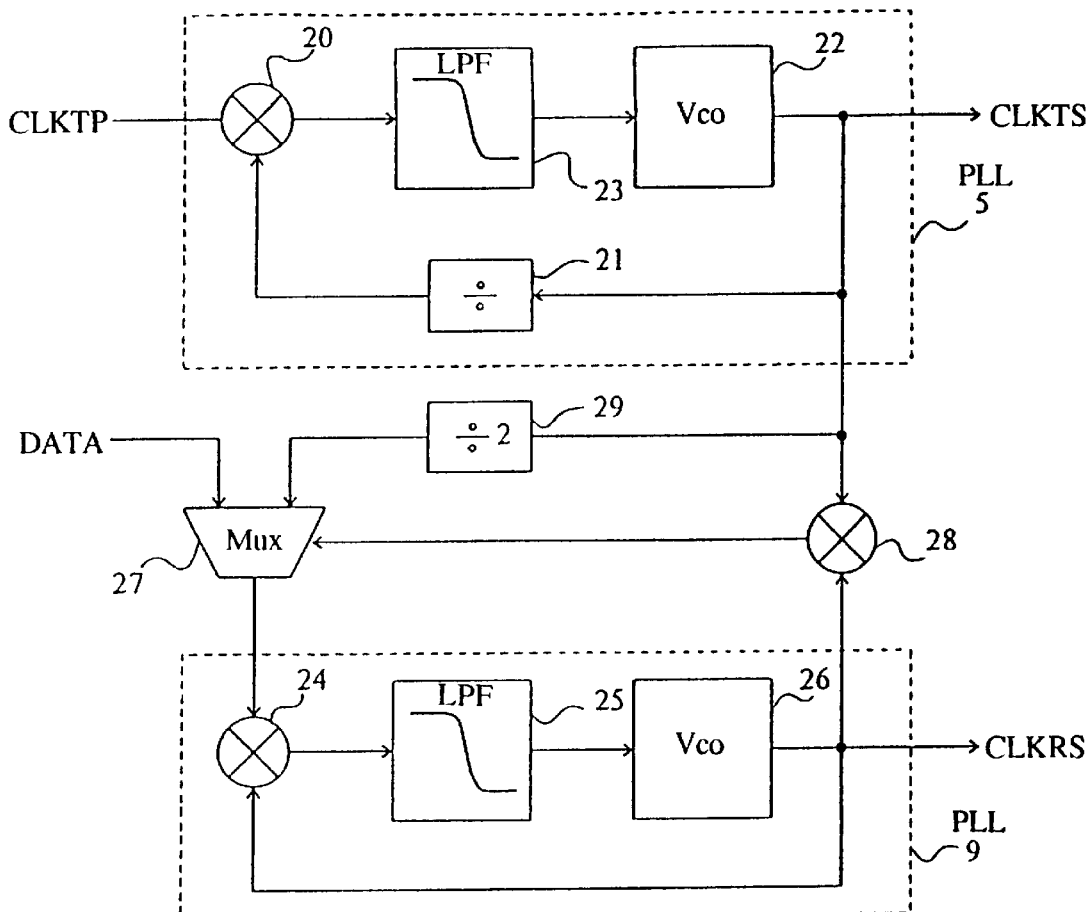
Figure 4:
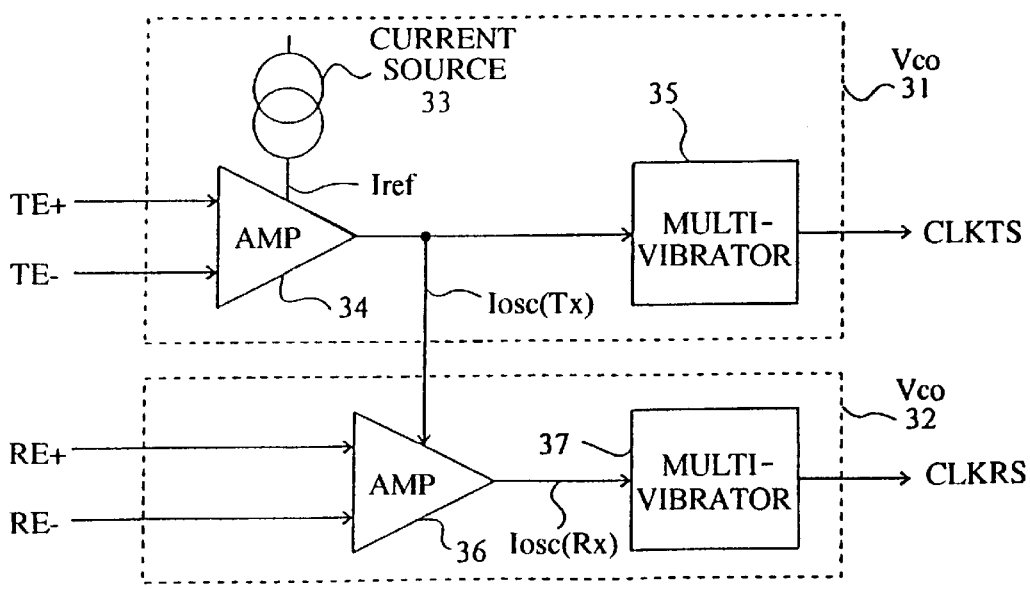
FIG. 4 represents an embodiment of a circuit for adjusting the free running frequency of an oscillator for extracting the frequency at which the data of an ATM circuit according to the present invention are received.

The circuit according to the invention, such as illustrated in FIG. 4, is designed to be integrated in an ATM circuit such as that illustrated in FIG. 1.

FIG. 4 illustrates the two VCO's 31 and 32 of the PLL's 5 and 9 associated with transmission unit 1 and reception unit 2, respectively.

VCO 31 associated with transmission unit 1 comprises an internal current source 33 constituted, for example, by a resistor which provides a differential amplifier 34, connected as a voltage-to-current converter, with a reference current Iref. The amplifier 34 receives at its two inputs the phase error voltages TE+ and TE– from the low-pass filter of the PLL 5. The voltage difference indicating the phase error is converted into a current Iosc(Tx) that is provided to the control terminal of the multivibrator 35 which is configured so as to have a free running frequency of approximately 622.08 MHz when Iosc(Tx) is equal to Iref.

In the reception unit, a differential amplifier 36 of VCO 32 receives at its two inputs the phase error voltages RE+ and RE– from the low pass filter of PLL 9. The output of the amplifier 36 also provides a control current Iosc(Rx) to multivibrator 37 of VCO 32. However, the reference current of amplifier 36 is the output current Iosc(Tx) of the differential amplifier 34 associated with VCO 31.

Thus, when the bits received by the unit 2 are steady, the two input voltages RE+ and RE– of amplifier 36 are the same and the output current Iosc(Rx) of amplifier 36 is fixed to Iosc(Tx). If, in contrast, the data signal can be used to extract the reception frequency, the difference between the two error voltages RE+ and RE– of the amplifier 36 causes the current Iosc(Rx) to vary about its reference value, in this case Iosc(Tx).

An aspect of the invention is to use the current for adjusting the oscillating frequency of the multivibrator associated with the transmission unit as a reference current of the multivibrator associated with the reception unit. Thus, instead of providing the transmission frequency in the reception unit, which requires an adjustment of the reception multivibrator through the PLL, the multivibrator is directly adjusted to this frequency by acting on its reference current.

The reference current variations of the multivibrator 37 associated with the reception unit are thus achieved about a value which already takes into account some operation parameters such as, for example, temperature. Thus, the middle value of current Iosc(Rx), and therefore the free running frequency of the multivibrator 37, correspond to the transmission frequency without using filters which induce a delay causing losses of data. The oscillation frequency variations of the multivibrator 37 no longer occur about a value fixed by an independent current source, but about the transmission frequency. The free running frequency of the reception oscillator is therefore very close to the real transmission frequency.

Henceforth, the difference between this free running frequency and the transmission frequency depends only on the technical differences of the components that are used and no longer, as previously, on the operation conditions.

According to the invention, the frequency adjustment currents Iosc(Tx) and Iosc(Rx) of the multivibrators 35 and 37 are obtained through a differential structure. An advantage of using the differential amplifiers 34 and 36 is that they reduce the noise in the signals that control the multivibrators 35 and 37, respectively, which are then less sensitive to any noise that may be present on the circuit supply lines. In addition, a differential structure reduces noise caused by the voltage-to-current converters in the supply lines. Thus, the phase jitter is reduced.

A further advantage of the present invention is that it increases the adjustment range of the VCO for the same amplitude of the error signal. For example, for a 1-volt amplitude of differential error voltage, each of voltages TE+ (or RE+) and TE− (or RE−) can vary between +0.5 volt and −0.5 volt. This creates an adjustment range corresponding to an error voltage varying between −1 volt (TE+=+0.5 volt and TE−=−0.5 volt) and +1 volt (TE+=+0.5 volt and TE−= −0.5 volt). This amounts to practically doubling the adjustment range of the oscillator with respect to a circuit in which the voltage-to-current converters do not receive a differential error signal (for example, a circuit such as described in U.S. Pat. No. 5,302,919).

According to an embodiment, the circuit is achieved in BiCMOS technology and all the differential stages, especially amplifiers 34 and 36, are of the bipolar type to ensure suitable operation at transmission frequencies on the order of several hundred MHz.

Preferably, the multivibrators 35 and 37 are on the same integrated circuit chip so that their components are homogenous. Thus, the only technology variations which should be taken into account for an optimum implementation of the invention are those associated with the sizes of the components on the same chip, which is easy to control.

The admissible tolerance in the technology variations is associated with the tolerable drift between the multivibrator frequencies. To prevent data from being lost, a drift lower than a 622.08 MHz half period should be obtained for 72 data bits.

Thus, the invention ensures optimum decoding of data received by the ATM circuit.

Another advantage of the invention is that it requires only one current source for two multivibrators associated with the transmission unit and the reception unit, respectively. Indeed, only the source providing current Iref is required, because the reference current of the reception multivibrator is provided by the transmission multivibrator. Thus, the current consumption of the asynchronous transmission circuit is lower. The current source 33 is, for example, constituted by a current source adjusted as a function of the operation temperature.

A further advantage of the present invention is that it makes it possible to carry out tests on the free running frequency of the VCO's without measures depending upon tolerances to obtain a specific reference value. Indeed, the differential error voltage need only be canceled, for example, by connecting the two input terminals of one differential amplifier 34 or 36 to obtain exactly the free running frequency of multivibrators 35 or 37, respectively. This is not the case in a circuit such as described in U.S. Pat. No. 5,302,919 because measuring would depend on the accuracy with which a reference voltage applied at the input of the voltage-to-current converter could be obtained. Thus, the invention enables, for example, a characterization of the circuit comprising the VCO's which is accurate and independent of any reference voltage.

As is apparent to those skilled in the art, various modifications can be made to the above disclosed preferred embodiments. More particularly, each described component can be replaced with one or more elements achieving the same function. In addition, any practical implementation of the astable multivibrators complying with the constraints and functional indications described above will readily appear to those skilled in the art.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A circuit for transmitting data in an asynchronous transfer mode comprising two phase-locked loops associated with a transmission unit and a reception unit, respectively, each phase-locked loop being provided with a voltage-controlled oscillator formed by an astable multivibrator, wherein a reference current which fixes the free running frequency of the astable multivibrator associated with the reception unit corresponds to a frequency adjustment current of the astable multivibrator associated with the transmission unit, each voltage-controlled oscillator comprising a differential amplifier connected as a voltage-to-current converter, the differential amplifier receiving two voltages being proportional to the phase error of the phase-locked loop with which the differential amplifier is associated and providing a frequency adjustment current to the astable multivibrator which the differential amplifier is associated.

2. The transmission circuit of claim 1, wherein the output of the differential amplifier of the transmission unit is connected to a reference current terminal of the differential amplifier of the reception unit.

3. The transmission circuit of claim 1, wherein all differential stages are achieved in bipolar technology.

4. The transmission circuit of claim 1, wherein a free running frequency of the astable multivibrator associated with the transmission unit is fixed by said reference current to substantially 622.08 MHZ.

5. An asynchronous transmission circuit comprising:
a transmission unit which includes a phase-locked loop having a voltage-controlled oscillator;
a reception unit which includes a phase-locked loop having a voltage-controlled oscillator;
wherein the voltage-controlled oscillator of the transmission unit provides a reference input current to the voltage-controlled oscillator of the reception unit and wherein each of the voltage-controlled oscillators of the transmission unit and the reception unit further comprise:
an astable multivibrator; and
a differential stage having an output current coupled to a reference current input of the astable multivibrator, the differential stage receiving two voltages being proportional to the phase error of the phase-locked loop with which the differential amplifier is associated.

6. The circuit of claim 5, wherein the differential stage of the transmission unit and the differential stage of the reception unit both comprise differential amplifiers connected as voltage-to-current converters.

7. The circuit of claim 5, wherein the current output of the differential stage of the transmission unit corresponds to the reference input current of the astable multivibrator of the reception unit.

8. The circuit of claim 7, wherein the output current of the differential stage of the transmission unit is connected to the reference input current of the astable multivibrator of the reception unit.

* * * * *